(12) United States Patent
Zhang

(10) Patent No.: US 12,218,073 B2
(45) Date of Patent: Feb. 4, 2025

(54) SEMICONDUCTOR MARKS AND FORMING METHODS THEREOF

(71) Applicant: CHANGXIN MEMORY TECHNOLOGIES, INC., Hefei (CN)

(72) Inventor: Shengan Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 697 days.

(21) Appl. No.: 17/431,756

(22) PCT Filed: Mar. 9, 2021

(86) PCT No.: PCT/CN2021/079668
§ 371 (c)(1),
(2) Date: Aug. 18, 2021

(87) PCT Pub. No.: WO2021/213032
PCT Pub. Date: Oct. 28, 2021

(65) Prior Publication Data
US 2023/0122820 A1      Apr. 20, 2023

(30) Foreign Application Priority Data

Apr. 23, 2020   (CN) .......................... 202010325831.1

(51) Int. Cl.
*H01L 23/544*  (2006.01)
*G01B 11/00*   (2006.01)
(Continued)

(52) U.S. Cl.
CPC ............ *H01L 23/544* (2013.01); *G01B 11/00* (2013.01); *G03F 7/20* (2013.01); *G03F 7/70633* (2013.01);
(Continued)

(58) Field of Classification Search
CPC ...... G03F 9/7076; G03F 7/20; G03F 7/70633; G03F 7/70683; H01L 21/68; H01L 2223/54426; G01B 11/00
See application file for complete search history.

(56) References Cited

U.S. PATENT DOCUMENTS 4,815,854 A * 3/1989 Tanaka ................. G03F 9/7076
356/509
5,528,372 A    6/1996 Kawashima
(Continued)

FOREIGN PATENT DOCUMENTS

CN         1577835 A    2/2005
CN       101158814 A    4/2008
(Continued)

OTHER PUBLICATIONS

Machine translation of WO-0127979-A1 (Year: 2024).*
(Continued)

*Primary Examiner* — Britt D Hanley
*Assistant Examiner* — Victor V Barzykin
(74) *Attorney, Agent, or Firm* — Kilpatrick Townsend & Stockton LLP

(57) ABSTRACT

The present disclosure relates to a semiconductor mark and a forming method thereof. The semiconductor mark comprises: a previous layer mark comprising first patterns and at least one second pattern, the second pattern being located between adjacent first patterns, the first pattern being different from the second pattern in material property. Since the first pattern and the second pattern in the previous layer mark in the semiconductor mark according to the present disclosure are different in material property, during measurement, the first pattern and the second pattern are different in reflectivity for measurement light. Thus, the contrast of images of the first pattern and the second pattern obtained during measurement is improved, the positions and bound- (Continued)

aries of the first pattern and the second pattern are clearly determined, and the measurement of the previous layer mark is more accurate.

13 Claims, 4 Drawing Sheets

(51) Int. Cl.
*G03F 7/00* (2006.01)
*G03F 7/20* (2006.01)
*G03F 9/00* (2006.01)
*H01L 21/68* (2006.01)

(52) U.S. Cl.
CPC ........ *G03F 7/70683* (2013.01); *G03F 9/7076* (2013.01); *H01L 21/68* (2013.01); *H01L 2223/54426* (2013.01)

(56) References Cited

U.S. PATENT DOCUMENTS

| | | | | |
|---|---|---|---|---|
| 6,037,671 | A * | 3/2000 | Kepler | G03F 9/7076 |
| | | | | 257/E23.179 |
| 7,034,406 | B2 | 4/2006 | Ido et al. | |
| 9,519,224 | B2 | 12/2016 | Gijsbertsen et al. | |
| 9,773,739 | B2 | 9/2017 | Lu et al. | |
| 10,474,039 | B2 * | 11/2019 | Hinnen | G03F 7/702 |
| 11,256,177 | B2 * | 2/2022 | Feler | G06T 7/33 |
| 11,294,293 | B2 * | 4/2022 | Hsieh | G03F 9/7088 |
| 2008/0034344 | A1 * | 2/2008 | Chiu | G03F 7/70633 |
| | | | | 430/5 |
| 2008/0212057 | A1 * | 9/2008 | Van Haren | G03F 9/7084 |
| | | | | 430/269 |
| 2008/0225254 | A1 * | 9/2008 | Komine | G03F 9/7076 |
| | | | | 430/5 |
| 2009/0225331 | A1 * | 9/2009 | Van Haren | G03F 7/70633 |
| | | | | 430/30 |
| 2017/0329217 | A1 * | 11/2017 | Minoda | G03F 7/0002 |
| 2019/0259708 | A1 * | 8/2019 | Tang | G03F 9/7076 |
| 2019/0285996 | A1 * | 9/2019 | Shibayama | B29C 43/04 |
| 2021/0072650 | A1 * | 3/2021 | Feler | G06T 7/68 |

FOREIGN PATENT DOCUMENTS

| | | |
|---|---|---|
| CN | 101593744 A | 12/2009 |
| CN | 102543667 A | 7/2012 |
| CN | 103917920 A | 7/2014 |
| CN | 204303805 U | 4/2015 |
| CN | 107037699 A | 8/2017 |
| EP | 1260870 A1 | 11/2002 |
| WO | 0127979 A1 | 4/2001 |

OTHER PUBLICATIONS

First CN Office Action cited in CN202010325831.1 mailed May 22, 2023, 7 pages.
International Search Report cited in PCT/CN2021/079668 mailed Apr. 23, 2020, 8 pages.

* cited by examiner

SEMICONDUCTOR MARKS AND FORMING METHODS THEREOF

CROSS-REFERENCE TO RELATED APPLICATIONS

The present disclosure claims the priority to Chinese Patent Application 202010325831.1, titled "SEMICONDUCTOR MARKS AND FORMING METHODS THEREOF", filed on Apr. 23, 2020, which is incorporated herein by reference in its entirety.

TECHNICAL FIELD

The present disclosure relates to the field of semiconductor manufacturing, in particular to a semiconductor mark and a forming method thereof.

BACKGROUND OF THE PRESENT INVENTION

In the manufacturing process of modern integrated circuits, different mark patterns are to be stacked on a wafer. Lithography is a process of forming mask patterns during semiconductor production. In order to ensure the performance of products, it is necessary to accurately align the mark patterns in each layer. In order to ensure the alignment effect of the mark patterns, it is necessary to improve the measurement accuracy of a previous layer alignment mark on the wafer during exposure by a lithography machine and a previous layer overlay mark on the wafer after exposure.

With the rapid development of the integrated circuit (IC) process and the miniaturization of the critical dimension (CD), the chip manufacturing process becomes more and more complicated. For example, the used sacrificial mask layers become thicker and thicker, and the number of stacked sacrificial mask layers is increasing. These factors lead to measurement images of the previous layer mark become unclear, so that the accurate position and boundary of the previous layer mark cannot be obtained and the measurement accuracy is thus affected.

SUMMARY OF THE PRESENT INVENTION

The technical problem to be solved by the present disclosure is to improve the measurement accuracy of a previous layer alignment mark on a wafer during exposure by a lithography machine and a previous layer overlay mark on the wafer after exposure.

A semiconductor mark, comprising:
a previous layer mark, comprising first patterns and at least one second pattern, the second pattern being located between adjacent first patterns, the first pattern being different from the second pattern in material property.

In one of the embodiments, the first pattern comprises a plurality of first sub-patterns and a plurality of second sub-patterns, and the first sub-pattern and the second sub-pattern are different in material property.

In one of the embodiments, the first sub-pattern, the second sub-pattern and the second pattern are all different in material property.

In one of the embodiments, the material property comprises a refractive index of a material and/or an extinction coefficient of the material.

In one of the embodiments, a ratio of a reflectivity of a material of the first pattern to a reflectivity of a material of the second pattern is greater than 1.2, or a ratio of the reflectivity of the material of the second pattern to the reflectivity of the material of the first pattern is greater than 1.2.

In one of the embodiments, the first sub-pattern and the second sub-pattern are single structure pattern, and the second pattern is composite structure pattern.

In one of the embodiments, a material of the first sub-pattern comprises any one of silicon oxide, silicon nitride, silicon oxynitride, silicon oxycarbide, silicon carbonnitride, carbon, boron-doped silicon oxide and phosphorus-doped silicon oxide, and a material of the second sub-pattern comprises any one of silicon oxide, silicon nitride, silicon oxynitride, silicon oxycarbide, silicon carbonnitride, carbon, boron-doped silicon oxide and phosphorus-doped silicon oxide.

In one of the embodiments, the composite structure pattern comprises a combined layer of a metal layer and any one of a metal nitride layer, a metal oxide layer and a metal silicide layer.

In one of the embodiments, a thickness of the metal layer is at least 40% to 90% of a height of the first sub-patterns or a height of the second sub-patterns.

In one of the embodiments, a dimension of the first pattern is greater than a dimension of the second pattern; the plurality of first sub-patterns are distributed at equal intervals and the plurality of first sub-patterns are the same in dimension; the plurality of second sub-patterns are distributed at equal intervals and the plurality of second sub-patterns are the same in dimension; and, both the dimension of the first sub-pattern and the dimension of the second sub-pattern are less than the dimension of the second pattern.

In one of the embodiments, the dimension of the first sub-pattern is ⅓ to ¾ of the dimension of the second sub-pattern.

In one of the embodiments, the previous layer comprises a previous layer alignment mark on a wafer during exposure by a lithography machine or a previous layer overlay mark on the wafer after exposure.

A method for forming a semiconductor mark, comprising:
providing a substrate; and
forming a previous layer mark on the substrate, the previous layer mark comprising first patterns and at least one second pattern, the second pattern being located between adjacent first patterns, the first pattern being different from the second pattern in material property.

In one of the embodiments, forming the first patterns comprises: forming a first material layer on the substrate; etching the first material layer, forming a plurality of first recesses and a plurality of protrusions among the first recesses, the protrusions forming first sub-patterns; filling a second material layer in the first recesses and forming second sub-patterns; and, forming the first patterns by the first sub-patterns and the second sub-patterns.

In one of the embodiments, a dimension of the first sub-patterns is ⅓ to ¾ of a dimension of the second sub-patterns.

In one of the embodiments, the method for forming the semiconductor mark further comprises: removing the protrusions after the second sub-patterns are formed; and, filling a third material layer at positions where the protrusions are removed to form the first sub-patterns.

In one of the embodiments, forming the second patterns comprises: forming second recesses in the first material layer on the substrate, the second recesses being larger than the first recesses and the protrusions in dimension; and, filling a fourth material layer in the second recesses.

In one of the embodiments, the fourth material layer comprises a combined layer of a metal layer and any one of a metal nitride layer, a metal oxide layer and a metal silicide layer, and a thickness of the metal layer is at least 40% to 90% of a height of the first sub-patterns or a height of the second sub-patterns.

In one of the embodiments, the first recesses and the second recesses are formed in the first material layer by an SADP process.

The semiconductor mark of the present disclosure comprises: a previous layer mark comprising first patterns and second patterns, the second patterns being located between adjacent first patterns, the first patterns being different from the second patterns in material property. Since the first patterns and the second patterns in the previous layer mark in the semiconductor mark according to the present disclosure are different in material property, during measurement, the first patterns and the second patterns are different in reflectivity for measurement light. Thus, the contrast of images of the first patterns and the second patterns obtained during measurement is improved, the positions and boundaries of the first patterns and the second patterns are clearly determined, and the measurement of the previous layer mark is more accurate.

DETAILED DESCRIPTION OF THE PRESENT INVENTION

The present disclosure relates to a semiconductor mark and a forming method thereof. The semiconductor mark comprises: a previous layer mark comprising first patterns and at least one second pattern, the second pattern being located between adjacent first patterns, the first pattern being different from the second pattern in material property. Since the first pattern and the second pattern in the previous layer mark in the semiconductor mark according to the present disclosure are different in material property, during measurement, the first pattern and the second pattern are different in reflectivity for measurement light. Thus, the contrast of images of the first pattern and the second pattern obtained during measurement is improved, so that the positions and boundaries of the first pattern and the second pattern are clearly determined, thereby improving the measurement accuracy of the previous layer mark.

In order to make the objectives, features and advantages of the present disclosure more apparent and comprehensible, the specific implementations of the present disclosure will be described below in detail with reference to the accompanying drawings. In the detailed description of the embodiments of the present disclosure, for convenience of description, the schematic diagrams are not partially enlarged in general scale, and the schematic diagrams are only examples and not intended to limit the protection scope of the present disclosure.

Figure 1:
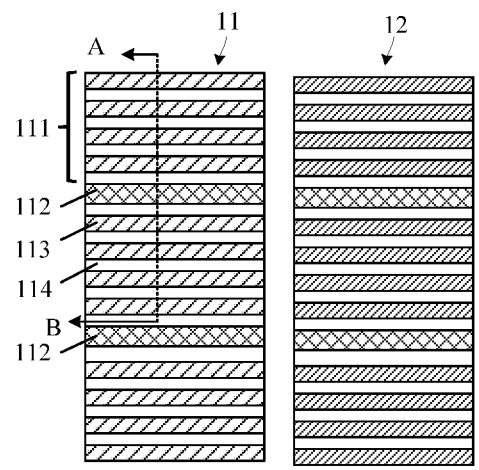
FIGS. 1-2 are schematic structure diagrams of a semiconductor mark according to an embodiment of the present disclosure.
Figure 2:
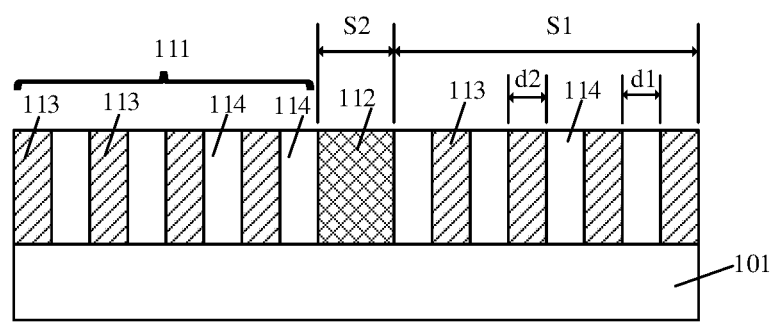
Figure 3:
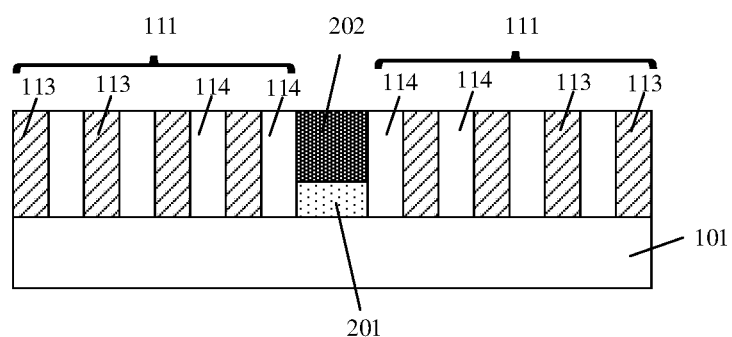
FIG. 3 is a schematic structure diagram of a semiconductor mark according to another embodiment of the present disclosure.
Figure 4:
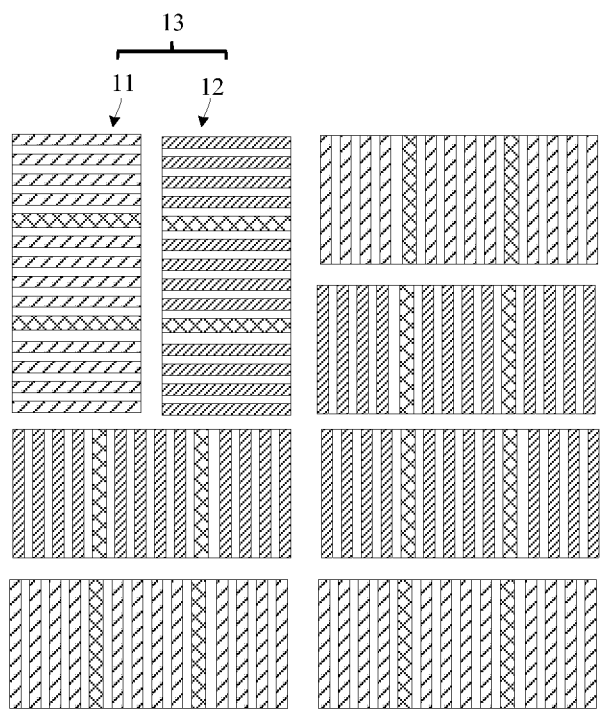
FIG. 4 is a schematic structure diagram of a semiconductor mark according to another embodiment of the present disclosure.

FIGS. 1-2 are schematic structure diagrams of a semiconductor mark according to an embodiment of the present disclosure; FIG. 3 is a schematic structure diagram of a semiconductor mark according to another embodiment of the present disclosure; FIG. 4 is a schematic structure diagram of a semiconductor mark according to another embodiment of the present disclosure; and, FIGS. 5-11 are schematic structure diagrams of a process of forming a semiconductor mark according to an embodiment of the present disclosure.

Referring to FIGS. 1 and 2, FIG. 2 is a schematic sectional view in a direction of the cutting line AB. An embodiment of the present disclosure provides a semiconductor mark, comprising:

a previous layer mark 11 comprising first patterns 111 and second patterns 112, the second patterns 112 being located between adjacent first patterns 111, the first patterns 111 being different from the second patterns 112 in material property.

The semiconductor mark is formed on a substrate. In one embodiment, the previous layer mark 11 is a previous layer overlay mark on a wafer after exposure. The semiconductor mark further comprises a current layer mark 12 corresponding to the previous layer mark 11. The current layer mark 12 is located above the previous layer mark 11. Specifically, a first material layer is firstly formed on the substrate, a first photoresist layer is then formed on the first material layer, and the first photoresist layer is subjected to a first (previous layer) lithography process to form a patterned first photoresist layer. The first material layer is etched by using the patterned first photoresist layer as a mask, to from the previous layer mark 11 in the first material layer. A second material layer is formed on the first material layer, a second photoresist layer is formed on the second material layer, and the second photoresist layer is subjected to a second (current layer) lithography process to form the current layer mark 12 in the second photoresist layer. The current layer mark 12 is located above the previous layer mark 11. The current layer mark 12 and the previous layer mark 11 together form an overlay mark for the previous layer and the current layer. An overlay error between current layer lithography and previous layer lithography is obtained by measuring a position offset of the current mark 12 relative to the previous layer mark 11 in the overlay mark. In other embodiments, the previous layer mark 11 is a previous layer alignment mark on the wafer during exposure by a lithography machine. The previous layer alignment mark is configured to position the wafer by the lithography machine.

The substrate may be a semiconductor substrate. The material of the semiconductor substrate may be Si, Ge, GeSi or SiC, or may be silicon on insulator (SOI) or germanium on insulator (GOI), or may be other materials, for example, III-V family compounds such as gallium arsenide. In other embodiments, the substrate may comprise a semiconductor substrate and at least one dielectric layer located on the semiconductor substrate.

There are at least two first patterns 111 and at least one second pattern 112, and one second pattern 112 is provided between two adjacent first patterns 111. In this embodiment, the description is given by taking the previous layer mark 11 shown in FIG. 1 comprising three first patterns 111 and two second patterns 112 as an example. In other embodiments, there may be other numbers of the first patterns 111 and the second patterns 112.

The first patterns 111 and the second patterns 112 are different in material property, and the material property comprises a refractive index of a material and/or an extinction coefficient of the material. In a specific embodiment, the refractive index of the first patterns 111 is different from that of the second patterns 112, or the extinction coefficient of the first patterns 111 is different from that of the second patterns 112, or the refractive index and extinction coefficient of the first patterns 111 are different from those of the second patterns 112. Specifically, the refractive index of the first patterns 111 ranges from 1 to 2, and the extinction coefficient of the first patterns 111 ranges from 0.2 to 0.8; and, the refractive index of the second patterns 112 ranges from 0 to 0.4, and the extinction coefficient of the second patterns 112 ranges from 1 to 3. In the semiconductor manufacturing process, the previous layer mark 11 will be covered by a subsequently formed dielectric layer or material layer. Since the first patterns 111 and the second patterns 112 in the previous layer mark 11 in the semiconductor mark according to the present disclosure are different in material property, during measurement, the first patterns 111 and the second patterns 112 are different in reflectivity for measurement light. Thus, the contrast of images of the first patterns and the second patterns obtained during measurement is improved, so that the positions and boundaries of the first patterns and the second patterns are clearly determined, the dielectric layer or material layer is prevented from affecting the position accuracy of the previous layer mark 11 during measurement, thereby improving the measurement accuracy of the previous layer mark 11.

In one embodiment, the ratio of the reflectivity of the material of the first patterns 111 to the reflectivity of the material of the second patterns 112 is greater than 1.2, or the ratio of the reflectivity of the material of the second patterns 112 to the reflectivity of the material of the first patterns 111 is greater than 1.2, so that the images of the first patterns 111 and the second patterns 112 obtained during measurement have a higher contrast.

In this embodiment, the first patterns 111 comprise a plurality of first sub-patterns 114 and a plurality of second sub-patterns 113, and the first sub-patterns 114 and the second sub-patterns 113 are different in material property.

In a specific embodiment, the first sub-patterns 114, the second sub-patterns 113 and the second patterns 112 are all different in material property. The material property comprises a refractive index of a material and/or an extinction coefficient of the material. Specifically, the first sub-patterns 114, the second sub-patterns 113 and the second patterns 112 may be made of different materials, so that the first sub-patterns 114, the second sub-patterns 113 and the second patterns 112 are all different in material property. In an example, the refractive indexes of the first sub-patterns 114 and the second sub-patterns 113 range from 1 to 2, and the extinction coefficients of the first sub-patterns 114 and the second sub-patterns 113 range from 0.2 to 0.8; and, the refractive index of the second patterns 112 ranges from 0 to 0.4, and the extinction coefficient of the second patterns 112 ranges from 1 to 3. For example, the refractive index of the first sub-patterns 114 is 1.5, and the extinction coefficient of the first sub-patterns 114 is 0.2; the refractive index of the second sub-patterns 113 is 2, and the extinction coefficient of the second sub-patterns 113 is 0.6; and, the refractive index of the second patterns 112 is 0.4, and the extinction coefficient of the second patterns 112 is 2.4. With such an arrangement, the intensity of light of the diffraction order reflected by the first patterns 111 can be enhanced, the contrast of images of the first patterns 111 and the second patterns 112 can be increased at the same time, and the measurement accuracy of the previous layer mark can be improved.

In one embodiment, the material of the first sub-patterns 114 comprises any one of silicon oxide, silicon nitride, silicon oxynitride, silicon oxycarbide, silicon carbonnitride, carbon, boron-doped silicon oxide and phosphorus-doped silicon oxide, and the material of the second sub-patterns 113 comprises any one of silicon oxide, silicon nitride, silicon oxynitride, silicon oxycarbide, silicon carbonnitride, carbon, boron-doped silicon oxide and phosphorus-doped silicon oxide.

In one embodiment, the first sub-patterns 114 and the second sub-patterns 113 are single structure patterns (single-layer structures), and the second patterns 112 are composite structure patterns (multi-layer stacked structures) or single structure patterns. Specifically, as shown in FIG. 3, the first sub-patterns 114 may be a single-layer silicon oxide layer, and the second sub-patterns 113 may be a single-layer silicon nitride layer. Each of the composite structure patterns (the second patterns 112) comprises a combined layer of a metal layer and any one of a metal nitride layer, a metal oxide layer and a metal silicide layer. The metal layer comprises a W, Al, Cu, Ti, Ag, Au, Pt or Ni layer. For example, each of the composite structure patterns (the second patterns 112) may be a dual-layer stacked structure of a metal nitride layer 201 and a metal layer 202, specifically a dual-layer stacked structure of a titanium nitride layer and a tungsten layer.

In one embodiment, the second patterns 112 are composite structure patterns, and each of the composite structure patterns (the second patterns 112) comprises a combined layer of a metal layer and any one of a metal nitride layer, a metal oxide layer and a metal silicide layer. The thickness of the metal layer 202 in the combined layer (the second patterns 112) is at least 40% to 90% of the height of the first sub-patterns 114 or the second sub-patterns 113, so that the contrast of the obtained images of the first patterns 111 and the second patterns 112 is obvious. For example, the thickness of the metal layer 202 is 45%, 55%, 65%, 75%, 85% or the like of the height of the first sub-patterns 114 or the second sub-patterns 113. Specifically, the material of the first sub-patterns 114 is silicon oxide, the material of the second sub-patterns 113 is silicon nitride, and the metal layer 202 is a tungsten layer. The thickness of the tungsten layer is 75% of the height of the first sub-patterns 114 or the second sub-patterns 113. At this time, the contrast of images of the first patterns 111 and the second patterns 112 during measurement can be increased.

In one embodiment, the dimension S1 of the first patterns 111 is greater than that S2 of the second patterns 112; the plurality of first sub-patterns 114 are distributed at equal intervals and are the same in dimension d1; the plurality of second sub-patterns 113 are distributed at equal intervals and are the same in dimension d2; and, both the dimension d1 of the first sub-patterns 114 and the dimension d2 of the second sub-patterns 113 are less than that S2 of the second patterns 112. Specifically, the dimension of the first sub-patterns or the dimension of the second sub-patterns is the same as the feature size of a chip internal region, so that the measured result of the first patterns is closer to the actual situation of the chip internal region. The feature size of the chip internal region may be the minimum feature size of the chip internal pattern in a photoresist layer where the first patterns are located. The first sub-patterns and the second sub-patterns may be formed by the same process as the chip internal pattern and finished in the same process step, so that the process of forming the first sub-patterns and the second sub-patterns is compatible with the process of forming the chip internal pattern and the process cost is thus reduced.

In another embodiment, the dimension d1 of the first sub-patterns 114 is ⅓ to ¾ (e.g., 5/12, 6/12, 7/12, etc.) of that d2 of the second sub-patterns 113. In one embodiment, the dimension d2 of the second sub-patterns 113 is 15 nm to 45 nm. Specifically, the dimension d2 of the second sub-patterns 113 is 30 nm, and the dimension d1 of the first sub-patterns 114 is 15 nm. With such an arrangement, the intensity of light of the diffraction order reflected by the previous layer mark can be enhanced, and the measurement accuracy of the previous mark can be improved during measurement using the diffracted light of the previous layer mark.

In another embodiment of the present disclosure, referring to FIG. 4, the semiconductor mark comprises four sub semiconductor marks 13 which are arranged in four square lattices. Two adjacent sub semiconductor marks 13 have a difference of 90 degrees in the arrangement direction, and each sub semiconductor mark 13 comprises a previous layer mark 11 and a current layer mark 12 located above the previous layer mark 11. The specific description refers to the description of the corresponding part of the foregoing embodiment, and will not be repeated here. By using the above combined semiconductor mark, errors in multiple directions can be measured simultaneously.

Another embodiment of the present disclosure further provides a method for forming a semiconductor mark, comprising:

providing a substrate; and forming a previous layer mark on the substrate, the previous layer mark comprising first patterns and second patterns, the second patterns being located between adjacent first patterns, the first patterns being different from the second patterns in material property.

The above process will be described below in detail with reference to FIGS. 5-11.

Figure 5:
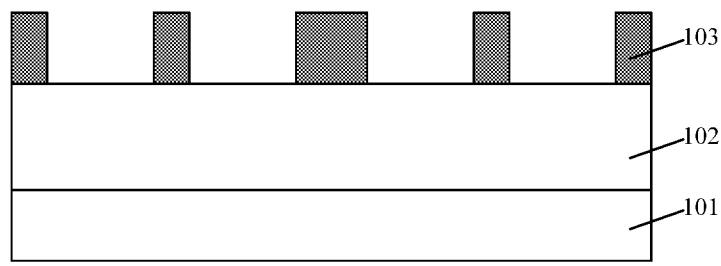
FIGS. 5-11 are schematic structure diagrams of a process of forming a semiconductor mark according to an embodiment of the present disclosure.

Referring to FIG. 5, a substrate 101 is provided, and a first material layer 102 is formed on the substrate 101.

The substrate 101 may be a semiconductor substrate. The material of the semiconductor substrate may be Si, Ge, GeSi or SiC, or may be silicon on insulator (SOI) or germanium on insulator (GOI), or may be other materials, for example, III-V family compounds such as gallium arsenide. In other embodiments, the substrate 101 may comprise a semiconductor substrate and at least one dielectric layer located on the semiconductor substrate.

The first material layer 102 is subsequently used to form first sub-patterns in the first patterns. The material of the first material layer 102 may be any one of silicon oxide, silicon nitride, silicon oxynitride, silicon oxycarbide, silicon carbonnitride, carbon, boron-doped silicon oxide and phosphorus-doped silicon oxide. In this embodiment, the material of the first material layer 102 is silicon oxide.

In the process of forming the previous layer mark in this embodiment, the first sub-patterns and second sub-patterns with a smaller feature size are formed by self-aligned double patterning (SADP). With continued reference to FIG. 5, a plurality of discrete sacrificial layer structures 103 are further formed on the surface of the first material layer 102. The material of the sacrificial layer structures 103 may be polycrystalline silicon, amorphous silicon, photoresist or other appropriate sacrificial materials.

Figure 6:
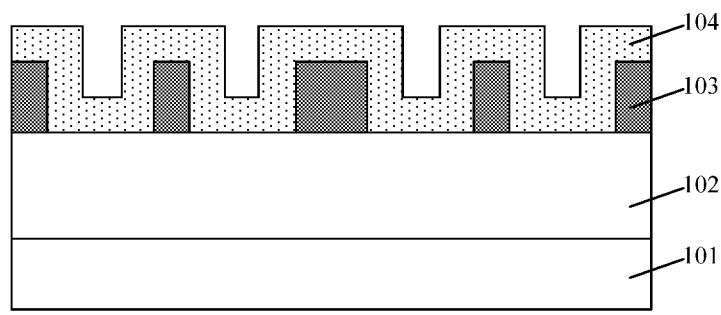

Referring to FIG. 6, a sidewall material layer 104 covering the sacrificial layer structures 103 and the surface of the first material layer is formed. The sidewall material layer 104 is formed by chemical vapor deposition, atomic layer deposition or other methods, and the sidewall material layer 104 may be made of silicon nitride or other appropriate materials.

Figure 7:
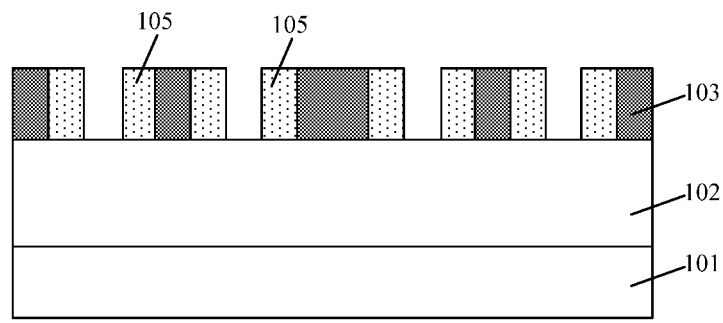

Referring to FIG. 7, the sidewall material layer 104 (referring to FIG. 6) is etched to form sidewalls 105 on the sidewalls of the sacrificial layer structures 103.

Figure 8:
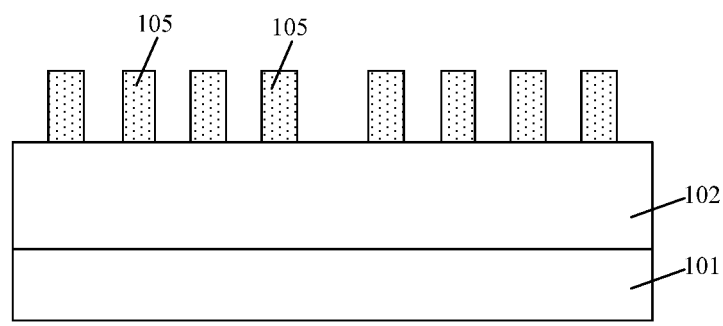

Referring to FIG. 8, the sacrificial layer structures 103 (referring to FIG. 7) are removed, and the remaining sidewalls 105 are used as pattern masks for subsequently etching of the first material layer 102.

Figure 9:
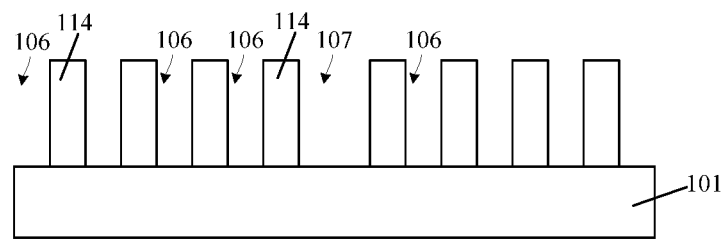

Referring to FIG. 9, the first material layer 102 (referring to FIG. 8) is etched using the sidewalls 105 (referring to FIG. 8) as masks, to form a plurality of first recesses 106 and a plurality of protrusions among the first recesses 106. The protrusions form the first sub-patterns 114.

The second sub-patterns are subsequently formed in the first recesses 106. In this embodiment, during etching the first material layer 102, second recesses 107 are also formed. The dimension of the second recesses 107 is greater than those of the first recesses 106 and the protrusions (the first sub-patterns 114). The second patterns are subsequently formed in the second recesses 107. In this embodiment, the first recesses 106 and the second recesses 107 are formed in the same process step. In other embodiments, the first recesses 106 and the second recesses 107 may be formed in different steps. For example, the first recesses 106 are formed firstly, and the second recesses 107 are then formed.

In one embodiment, during etching the first material layer to form the first recesses 106, the sidewalls 105 may also be removed. In other embodiments, the sidewalls 105 may be removed by an additional etching process after the first recesses 106 are formed, or the sidewalls 105 may be removed by a chemical mechanical grinding process, when the second sub-patterns 113 is subsequently formed.

Figure 10:
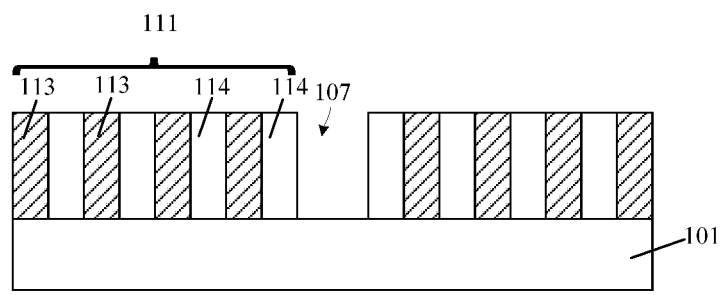

Referring to FIG. 10, a second material layer is filled in the first recesses 106 (referring to FIG. 9) to form the second sub-patterns 113, and the first sub-patterns 114 and the second sub-patterns 113 form the first patterns.

In one embodiment, the dimension of the first sub-patterns is ⅓ to ¾ of that of the second sub-patterns.

The first material layer is different from the second material layer in material, so that the formed second sub-patterns 113 are different from the first sub-patterns 114 in property. In one embodiment, the material of the second material layer comprises any one of silicon oxide, silicon nitride, silicon oxynitride, silicon oxycarbide, silicon carbonnitride, carbon, boron-doped silicon oxide and phosphorus-doped silicon oxide. In this embodiment, the material of the second material layer is silicon nitride.

In one embodiment, the process of forming the second sub-patterns 113 comprises: forming a second material layer in the first recesses 106 (referring to FIG. 9) and on the surface of the first sub-patterns 114, and filling the first recesses by the second material layer; removing, by a chemical mechanical grinding process, the second material layer that is higher than the top surfaces of the first sub-patterns 114, and forming the second sub-patterns 113 in the first recesses.

In one embodiment, the second material layer in the second recesses 107 is removed after the second sub-patterns are formed.

In other embodiments, the protrusions are removed after the second sub-patterns 113 are formed, a third material layer is filled at positions where the protrusions are removed to form the first sub-patterns 114.

Figure 11:
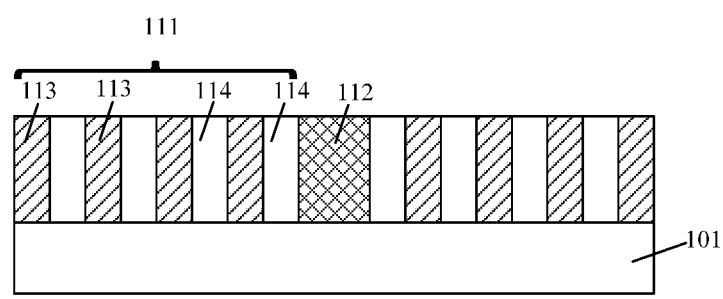

Referring to FIG. 11, a fourth material layer is filled in the second recesses (referring to FIG. 10) to form the second patterns 112.

In one embodiment, the fourth material layer comprises a combined layer of a metal layer and any one of a metal nitride layer, a metal oxide layer and a metal silicide layer, and the thickness of the metal layer is at least 40% to 90% of the height of the first sub-patterns or the second sub-patterns. The step of forming the second patterns 112 may be compatible with the process of forming a metal wire or metal layer. Specifically, the substrate may comprise a semiconductor mark region for forming a semiconductor mark and a chip internal region for forming a semiconductor device. The semiconductor device comprises a metal wire or a metal layer. In this embodiment, during forming a metal wire or metal layer in the chip internal region, the second patters are formed in the second recesses 107.

Although the present disclosure has been described above by preferred embodiments, it is not intended to limit the present disclosure. Any person of skill in the art can make possible changes and alterations to the technical solutions of the present disclosure by using the methods and technical contents disclosed above, without departing from the spirit and scope of the present disclosure. Therefore, any simple alterations, equivalent changes and modifications made to the foregoing embodiments according the technical essence of the present disclosure without departing from the contents of the technical solutions of the present disclosure shall fall into the protection scope of the technical solutions of the present disclosure.

The invention claimed is:

1. A semiconductor mark, comprising:
a previous layer mark, comprising first patterns and second pattern, the second pattern being located between adjacent first patterns, the first pattern being different from the second pattern in material property; and, wherein
the previous layer mark comprises a previous layer alignment mark on a wafer during exposure by a lithography machine or a previous layer overlay mark on the wafer after exposure;
the material property comprises a refractive index of a material and/or an extinction coefficient of the material;
the first pattern comprises a plurality of first sub-patterns and a plurality of second sub-patterns, and the first sub-patterns and the second sub-patterns are different in material property; and
a dimension of the first sub-patterns is ⅓ to ¾ of a dimension of the second sub-patterns.

2. The semiconductor mark according to claim 1, wherein the first sub-patterns, the second sub-patterns and the second pattern are all different in material property.

3. The semiconductor mark according to claim 1, wherein a ratio of a reflectivity of a material of the first pattern to a reflectivity of a material of the second pattern is greater than 1.2, or a ratio of the reflectivity of the material of the second pattern to the reflectivity of the material of the first pattern is greater than 1.2.

4. The semiconductor mark according to claim 1, wherein the first sub-pattern and the second sub-pattern are single structure pattern, and the second pattern is composite structure pattern.

5. The semiconductor mark according to claim 4, wherein a material of the first sub-pattern comprises any one of silicon oxide, silicon nitride, silicon oxynitride, silicon oxycarbide, silicon carbide, silicon carbonnitride, carbon, boron-doped silicon oxide and phosphorus-doped silicon oxide, and a material of the second sub-pattern comprises any one of silicon oxide, silicon nitride, silicon oxynitride, silicon oxycarbide, silicon carbonnitride, carbon, boron-doped silicon oxide and phosphorus-doped silicon oxide.

6. The semiconductor mark according to claim 5, wherein the composite structure pattern comprises a combined layer of a metal layer and any one of a metal nitride layer, a metal oxide layer and a metal silicide layer.

7. The semiconductor mark according to claim 6, wherein a thickness of the metal layer is at least 40% to 90% of a height of the first sub-patterns or a height of the second sub-patterns.

8. The semiconductor mark according to claim 4, wherein a dimension of the first pattern is greater than a dimension of the second pattern; the plurality of first sub-patterns are distributed at equal intervals and the plurality of first sub-patterns are the same in dimension; the plurality of second sub-patterns are distributed at equal intervals and the plurality of second sub-patterns are the same in dimension; and, both the dimension of the first sub-pattern and the dimension of the second sub-pattern are less than the dimension of the second pattern.

9. A method for forming a semiconductor mark, comprising:
providing a substrate; and
forming a previous layer mark on the substrate, the previous layer mark comprising first patterns and second pattern, the second pattern being located between adjacent first patterns, the first pattern being different from the second pattern in material property; and, wherein
the previous layer mark comprises a previous layer alignment mark on a wafer during exposure by a lithography machine or a previous layer overlay mark on the wafer after exposure;
the material property comprises a refractive index of a material and/or an extinction coefficient of the material; and
forming the first patterns comprises:
forming a first material layer on the substrate;
etching the first material layer, forming a plurality of first recesses and a plurality of protrusions among the first recesses, the protrusions forming first sub-patterns;
filling a second material layer in the first recesses and forming second sub-patterns; and
forming the first patterns by the first sub-patterns and the second sub-patterns, wherein a dimension of the first sub-patterns is ⅓ to ¾ of a dimension of the second sub-patterns.

10. The method for forming the semiconductor mark according to claim 9, further comprising:
removing the protrusions after the second sub-patterns are formed; and
filling a third material layer at positions where the protrusions are removed, to form the first sub-patterns.

11. The method for forming the semiconductor mark according to claim 9, wherein forming the second patterns comprises:
forming second recesses in the first material layer on the substrate, the second recesses being larger than the first recesses and the protrusions in dimension; and
filling a fourth material layer in the second recesses.

12. The method for forming the semiconductor mark according to claim 11, wherein the fourth material layer comprises a combined layer of a metal layer and any one of a metal nitride layer, a metal oxide layer and a metal silicide layer, and a thickness of the metal layer is at least 40% to 90% of a height of the first sub-patterns or a height of the second sub-patterns.

13. The method for forming the semiconductor mark according to claim 11, wherein the first recesses and the second recesses are formed in the first material layer by an SADP process.

\* \* \* \* \*